United States Patent
Huang et al.

(10) Patent No.: US 7,126,359 B2
(45) Date of Patent: Oct. 24, 2006

(54) DEVICE MONITOR FOR RF AND DC MEASUREMENT

(75) Inventors: Guo-Wei Huang, Hsinchu (TW); Kun-Ming Chen, Jhunan Township, Miaoli County (TW); Da-Yuan Chiu, Hsinchu (TW); Sheng-Yu Wen, Yonghe (TW); Ming-Hsiang Cho, Jhubei (TW); Sheng-Chun Wang, Tucheng (TW); Yu-Ming Teng, Cyonglin Township, Hsinchu County (TW); Chia-Sung Chiu, Jhongli (TW)

(73) Assignee: National Applied Research Laboratories, Taipei (TW)

( * ) Notice: Subject to any disclaimer, the term of this patent is extended or adjusted under 35 U.S.C. 154(b) by 0 days.

(21) Appl. No.: 11/008,458

(22) Filed: Dec. 9, 2004

(65) Prior Publication Data

US 2005/0184742 A1 Aug. 25, 2005

(30) Foreign Application Priority Data

Feb. 25, 2004 (TW) .............................. 93104737 A

(51) Int. Cl.
*G01R 31/02* (2006.01)
(52) U.S. Cl. ...................... 324/754; 324/765
(58) Field of Classification Search ................ 324/765, 324/754, 158.1, 769, 763; 438/14, 17, 18; 257/48

See application file for complete search history.

(56) References Cited

U.S. PATENT DOCUMENTS

| | | | | |
|---|---|---|---|---|
| 5,194,932 A | * | 3/1993 | Kurisu | 257/773 |
| 5,453,994 A | * | 9/1995 | Kawamoto et al. | 324/765 |
| 5,594,358 A | * | 1/1997 | Ishikawa et al. | 324/762 |
| 5,942,766 A | | 8/1999 | Frei | 257/48 |
| 6,194,739 B1 | * | 2/2001 | Ivanov et al. | 257/48 |
| 6,300,765 B1 | * | 10/2001 | Chen | 324/519 |
| 6,304,097 B1 | * | 10/2001 | Chen | 324/765 |
| 6,465,267 B1 | * | 10/2002 | Wang et al. | 438/17 |
| 6,777,971 B1 | * | 8/2004 | Kirloskar et al. | 324/765 |

* cited by examiner

*Primary Examiner*—Jermele Hollington
(74) *Attorney, Agent, or Firm*—Thomas, Kayden, Horstemeyer & Risley

(57) ABSTRACT

A device monitor for RF and DC measurement. The device monitor comprises a plurality of test cells arranged substantially in line. The test cell comprises a device under test, an input pad, an output pad and at least two reference pads. The input pad is electrically connected to an input of the DUT. The output pad is electrically connected to an output of the DUT. At least one of the reference pads is electrically connected to the DUT to provide a reference level. The input pad, the output pad and the reference pads are arranged substantially in line and at least one of the reference pads is located between the input pad and the output pad.

10 Claims, 6 Drawing Sheets

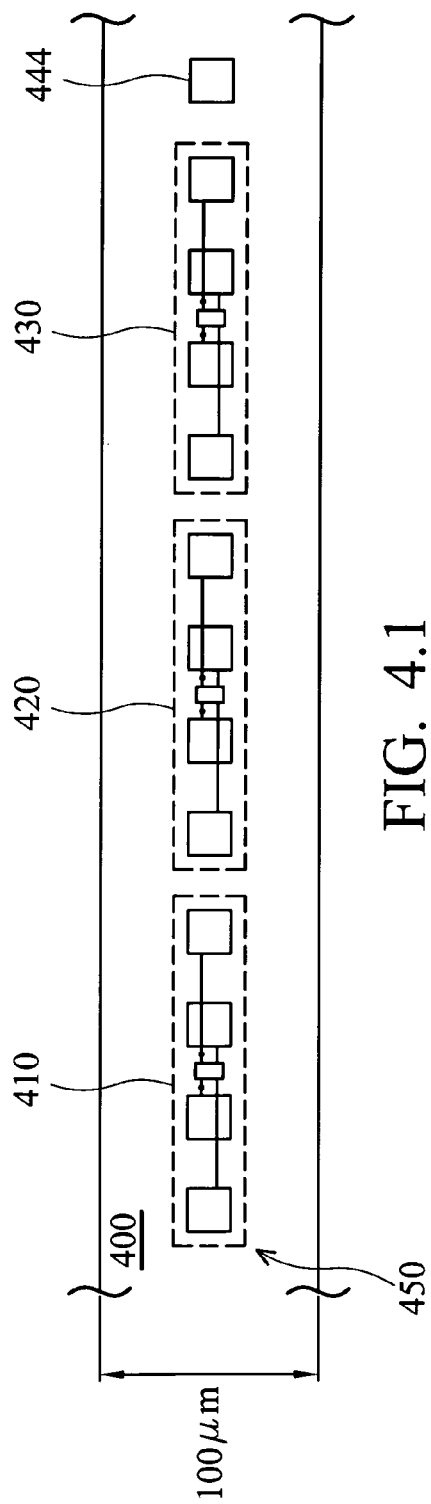
FIG. 4.1
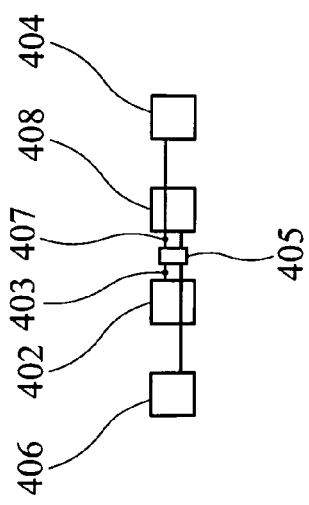
FIG. 4.2

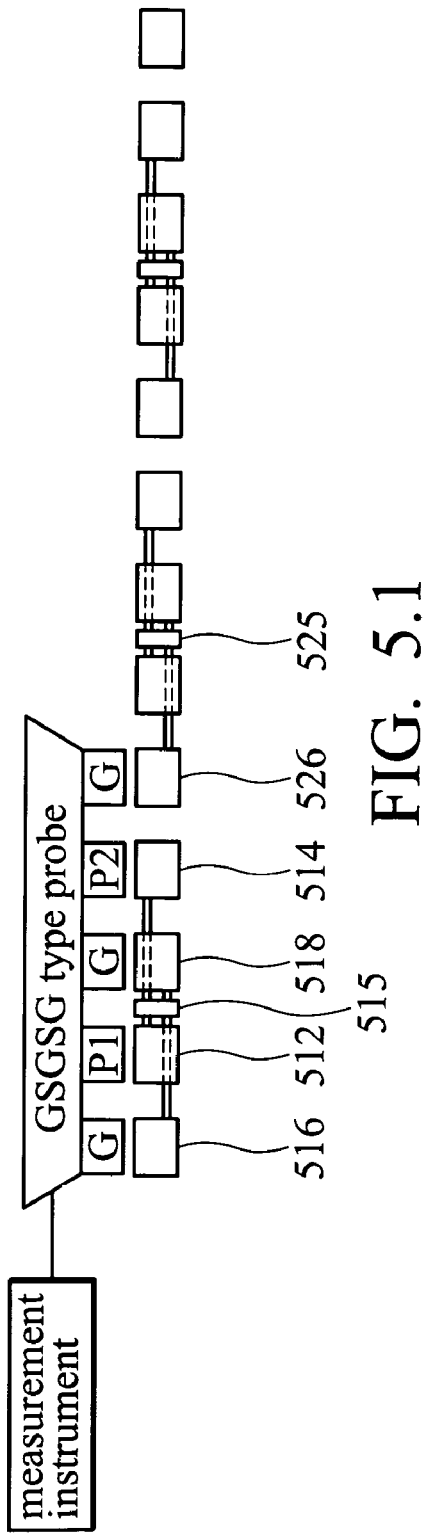
FIG. 5.1
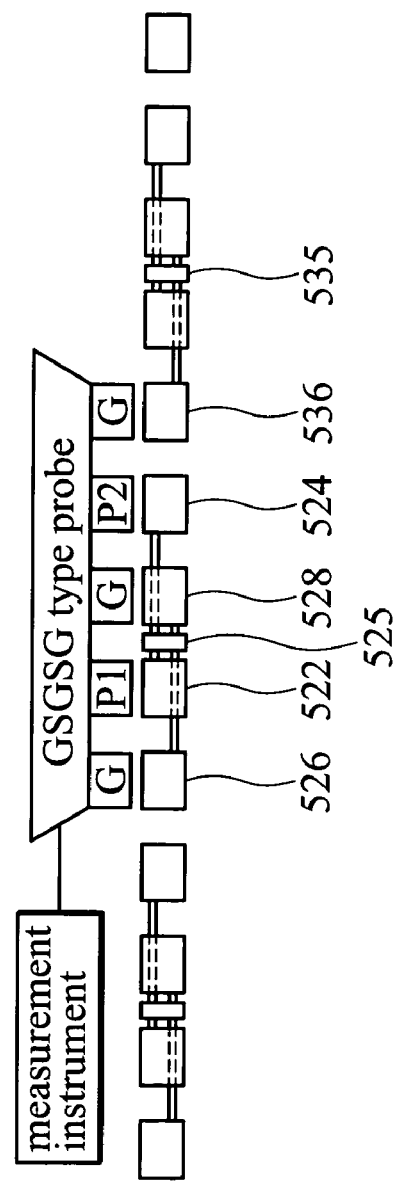
FIG. 5.2

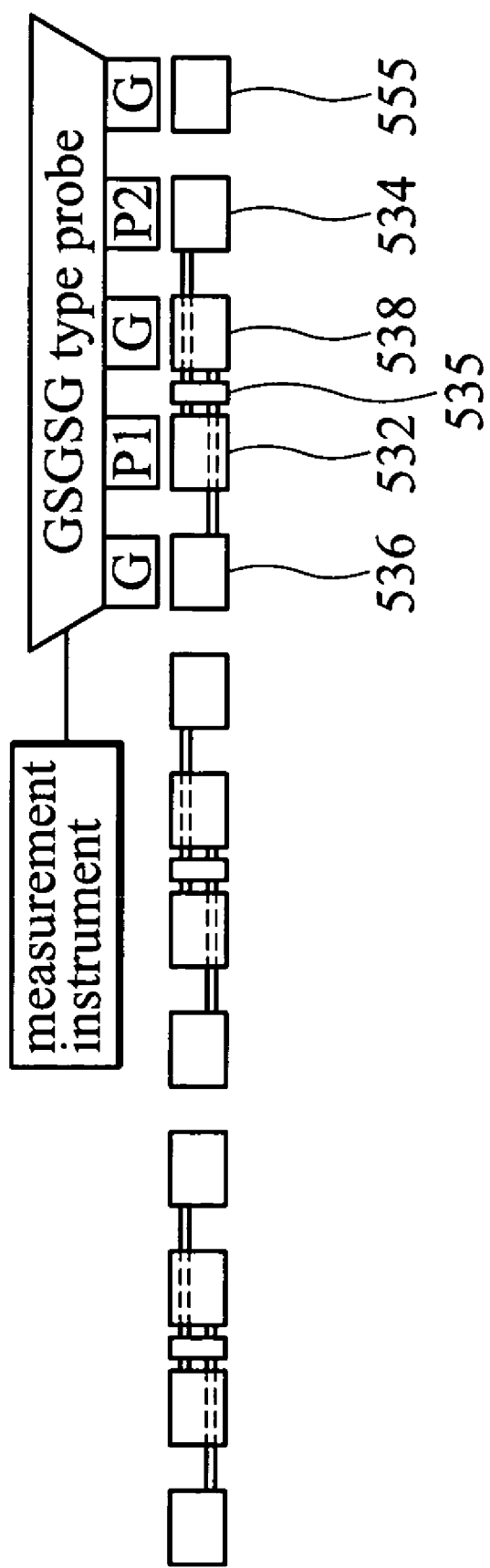
FIG. 5.3

DEVICE MONITOR FOR RF AND DC MEASUREMENT

BACKGROUND

The invention relates to electrical testing of an IC component and, in particular, to a test structure of a device monitor.

Integrated circuits are typically fabricated on a semiconductor wafer. After semiconductor processing is finished, the wafer is sawed into multiple chips. Before die sawing, the chips are arranged in an array on the wafer and divided by scribe lines or streets. To enhance utilization of wafer area, these scribe lines or streets receive device monitors. Devices under test are embedded in the device monitors. The structures of the devices under test are the same as components in the wafer and are fabricated with the same process. Thus, by measuring the devices under test operating under different conditions, it is known whether the components comply with the model on which the chip design is based. Behavior of the chip can be predicted before die sawing or chip testing with expensive testers so that production cost can be reduced. Accordingly, to obtain accurate measurement results with minimum chip area occupied by the device monitors becomes important.

Conventional device monitors are categorized according to operating frequency. One group is suitable for measurement under DC or very low frequency (~1 MHz). The other group is suitable for measurement under very high frequency. The device monitors for very high frequency are also divided into two groups as follows.

The first group of device monitors is a GS (ground-signal) type test structure, as shown in FIG. 1, disclosed in U.S. Pat. No. 5,942,766. The test structure is located at the intersection of two scribe lines such that part of the test structure is in the first scribe line while other part is in the second scribe line. Thus, the test structure accommodates a narrower scribe line (~100 um).

The second group of device monitors is GSG (ground-signal-ground) type test structure, as shown in FIGS. 2 and 3. Symmetry of the GSG test structures guarantees symmetry of the electromagnetic field. Better EM field termination from a signal end to a ground end is also provided so that interference can be minimized. Thus, measurement accuracy in high frequency environment can be improved. The GSG type test structure disclosed in U.S. Pat. No. 6,194,739 is shown in FIG. 3. Six pads thereof are arranged substantially in line with a device under test (DUT) so that the test structure accommodates a narrower scribe line. The DUT mentioned herein is typically a metal oxide semiconductor field effect transistor (MOSFET) or a bipolar junction transistor (BJT).

In addition, in traditional RF test structures in FIGS. 2 and 3, to obtain accurate high frequency measurement results of four terminal DUTS, such as a MOSFET or a BJT, two ends other than the input and output are connected. Accordingly, the test structures cannot be used for DC electrical parameter extraction when the two ends require a specific bias condition for each terminal.

SUMMARY

An embodiment of a device monitor for RF and DC measurement comprises a plurality of test cells arranged substantially in line. Each test cell comprises a device under test (DUT), an input pad, an output pad, and at least two reference pads. The input pad is connected to an input of the DUT. The output pad is connected to an output of the DUT. At least one of the reference pads is connected to the DUT to provide a reference potential thereto. The input pad, the output pad and the reference pads are arranged substantially in line. At least one of the reference pads is located between the input pad and the output pad.

The device monitor provided by the invention provides high measurement accuracy in high frequency environments. The number of pads and wafer estate required are reduced. Additionally, the test structure is compatible with a DC probe card used during mass wafer testing in fabs so that DC device characterization can be obtained.

DESCRIPTION OF THE DRAWINGS

FIGS. 4.1 and 4.2 illustrate a device monitor of an embodiment according to the invention and test cells therein.

FIGS. 5.1~5.3 illustrate how a device monitor of an embodiment according to the invention is used under RF measurement.

DETAILED DESCRIPTION

Figure 1:
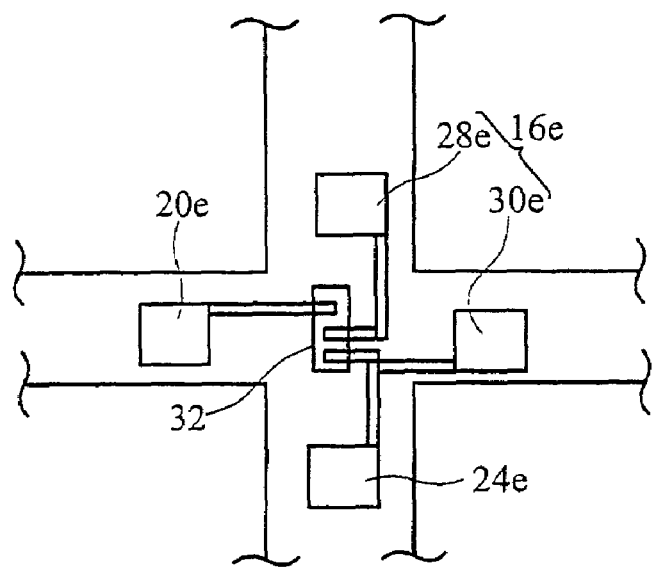
FIG. 1 illustrates a GS type test structure disclosed in U.S. Pat. No. 5,942,766.
Figure 2:
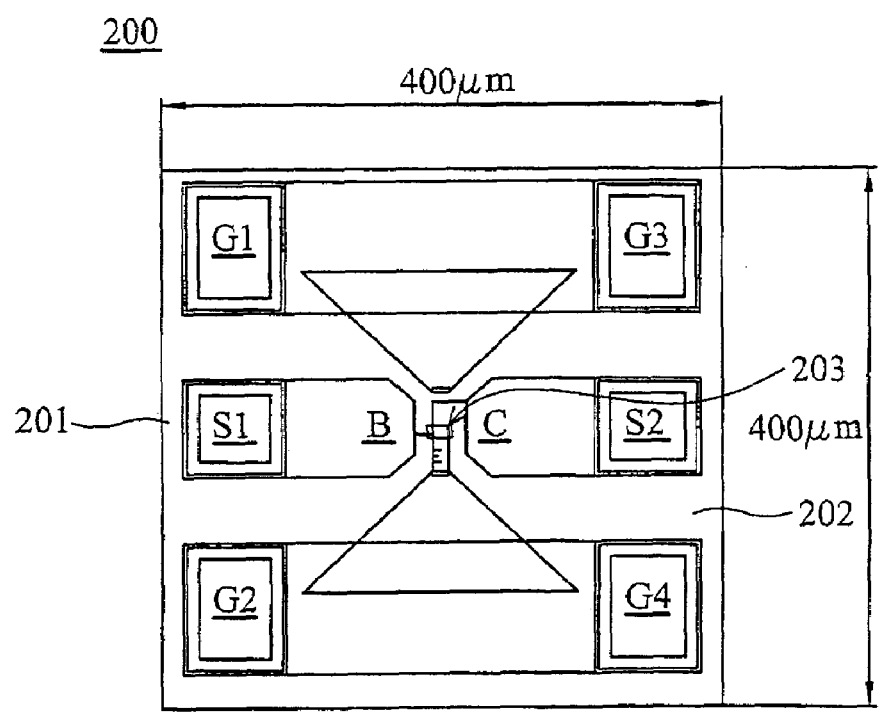
FIG. 2 shows a conventional GSG type test structure.
Figure 3:
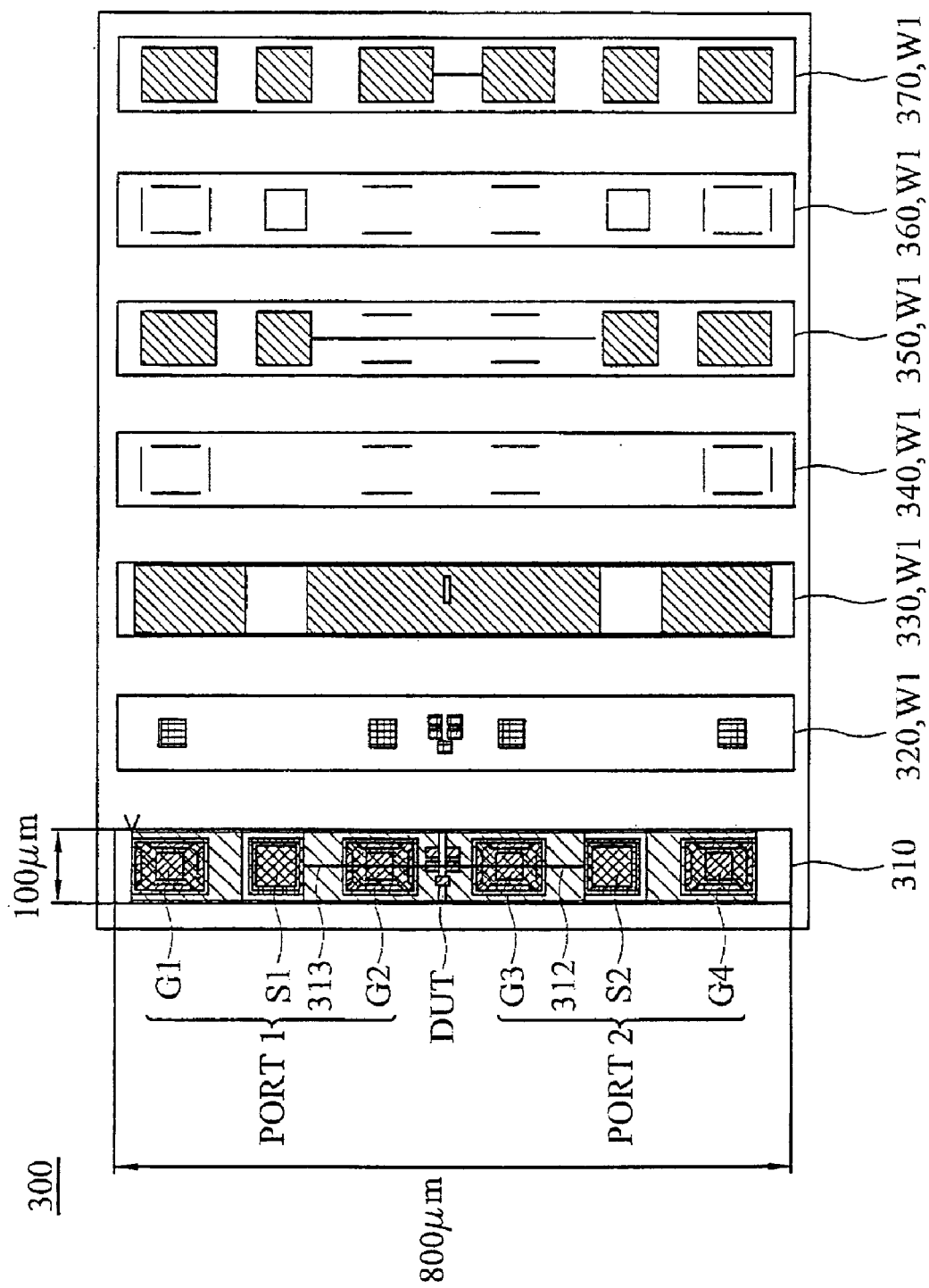
FIG. 3 illustrates a GSG type test structure disclosed in U.S. Pat. No. 6,194,739.

FIG. 4.1 shows a device monitor of an embodiment according to the invention. The device monitor 400 comprises test cells 410, 420, 430 and a dummy pad 444. The test cells and the dummy pad 444 are arranged substantially in line. Thus, the device monitor 400 accommodates a scribe line 450 which is narrower, about 100 μm for example. It is noted that the dummy pad is not the dummy pad for de-embedding during RF device characterization, but rather an extra pad for high frequency measurement. Structure of the test cells 410,420 and 430 is shown in FIG. 4.2. The structure comprises a device under test (DUT) 405, an input pad 402, an output pad 404 and reference pads 406 and 408. The input pad 402 is connected to an input 403 of the DUT 405. The output pad 404 is connected to an output 407 of the DUT 405. The reference pads 406 and 408 are connected to the DUT and coupled to a reference potential. The input pad 402, the output pad 404 and the reference pads 406,408 are arranged substantially in line. The reference pad 408 is disposed between the input pad 402 and the output pad 404.

A MOSFET is taken as an example of a device monitor to illustrate testing thereof in an RF environment. High frequency characterization of each MOSFET can be obtained through an GSGSG (ground-signal-ground-signal-ground) type probe with a pitch of 100 μm, as shown in FIGS. 5.1~5.3.

In a test cell comprising a first MOSFET 515, as shown in FIG. 5.1, an input pad 512 is probed by a probe needle P1, an output pad 514 is probed by a probe P2 and two ground needles of the GSGSG type probe probe the reference pads 516, 518, connected to a body and a source of the first MOSFET 515. Meanwhile, the third ground needle is in contact with the reference pad 526, connected in turn to a body (or source) of the second MOSFET 525. When measurement is carried out, a measurement instrument or tester transmits an input signal to the gate of the first MOSFET 515 via the probe needle P1 and the input pad 512. An output signal is transmitted from the drain of the first MOSFET 515, via the probe needle P2 and the output pad 514, to an input port of the measurement instrument or tester. The body and the source of the first MOSFET 515 can be grounded through the reference pads 516, 518 and the ground needles. Thus, only 5 pads are required to measure device characterization of the first MOSFET 515, with ground needles on both sides of the probe needles P1, P2. As a result, high measurement accuracy under high frequency can also be obtained using GSGSG type probe.

In a test cell comprising a second MOSFET 525, as shown in FIG. 5.2, an input pad 522 is probed with a probe needle P1, an output pad 524 is probed by a probe needle P2 and two ground needles of the GSGSG type probe probe the reference pads 526, 528, connected to a body and a source of the second MOSFET 525. Meanwhile, the third ground needle is in contact with the reference pad 536, connected in turn to a body (or source) of the third MOSFET 535. When measurement is carried out, a measurement instrument or tester transmits an input signal to the gate of the second MOSFET 525 via the probe needle P1 and the output pad 522. An output signal is transmitted from the drain of the second MOSFET 525, via the probe needle P2 and the input pad 524, to the measurement instrument or tester. The body and the source of the second MOSFET 525 can be grounded via the reference pads 526, 528 and the ground needles. Thus, only 5 pads are required to measure device characterization of the second MOSFET 525, with ground needles on both sides of the probe needles P1, P2.

In a test cell comprising a third MOSFET 535, as shown in FIG. 5.3, an input pad 532 is probed by a probe needle P1, an output pad 534 is probed by a probe needle P2 and two ground needles of the GSGSG type probe probe the reference pads 536, 538, connected to a body and a source of the third MOSFET 535. Meanwhile, the third ground needle is in contact with a dummy pad 555. When measurement is carried out, a measurement instrument or tester transmits an input signal to the gate of the third MOSFET 535 via the probe needle P1 and the input pad 532. An output signal is transmitted from the drain of the third MOSFET 535, via the probe needle P2 and the output pad 534, to the measurement instrument or tester. The body and the source of the third MOSFET 535 can be grounded via the reference pads 536, 538 and the ground needles. Thus, only 5 pads are required to measure device characterization of the third MOSFET 535, with ground needles on both sides of the probe needles P1, P2.

Six pads are required to measure a device when a conventional GSG type probe is used. When n devices are tested, 6n pads are needed. To the contrary, only 5 pads are required to measure one device for the device monitor of the invention. When a plurality of devices is tested, since some pads can be used repeatedly during measurement, only 4n+1 pads are needed to test n devices. Thus, the device monitor of the invention occupies much less area than the conventional device monitor. Additionally, since all pads and the DUT are arranged substantially in line in the device monitor of the invention, the device monitor accommodates a narrower scribe line, about 100 μm for instance.

Figure 6:
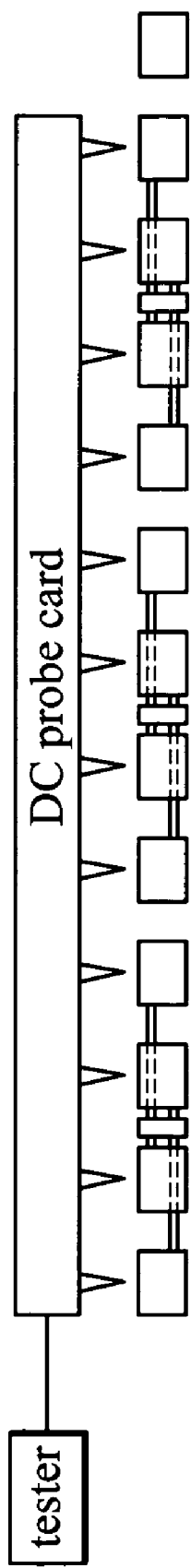
FIG. 6 illustrates how a device monitor of an embodiment according to the invention is used under DC measurement.

As shown in FIG. 6, the device monitor of the embodiment according to the invention can be used to measure device characterization in a DC environment. For a conventional RF device monitor, to accurately measure a device under test (DUT) such as a MOSFET or a BJT at a high frequency, the two ends other than the input and output are typically connected. As a result, the conventional device monitor cannot be used to extract electrical parameters when the two ends require a specific bias condition for the device monitor of the invention. To the contrary, the pads corresponding to a source and body of a MOSFET (or an emitter and substrate of a BJT) do not require connection. In addition, all pads and the DUT are arranged substantially in line so that a DC probe card for process control monitor (PCM) is compatible with the device monitor of the invention.

While the DUT in the embodiment is applied to a MOSFET, the DUT can also be a high frequency transistor such as a bipolar junction transistor (BJT), a metal semiconductor field effect transistor (MESFET), a hetero-junction bipolar transistor (HBT) or a pseudo high electron mobility transistor (pHEMT). Moreover, the DUT can be a varactor, a metal-insulator-metal (MIM) capacitor or a spiral inductor. When the DUT is a BJT, the input end is typically a base and the output end is typically a collector. When the DUT is a MESFET, the input end is typically a gate and the output end is typically a drain.

Generally speaking, an ideal RF device monitor provides high measurement accuracy and occupies very small wafer area. A conventional RF device monitor cannot provide both advantages. However, the device monitor of the invention not only provides both advantages but also reduces the number of pads required and accommodates a narrower scribe line, about 100 μm for instance. As well, the device monitor of the invention can be used for measuring device characterization in a DC environment and is compatible with the DC probe card used for mass wafer testing in fabs.

While the invention has been described by way of example and in terms of preferred embodiment, it is to be understood that the invention is not limited thereto. To the contrary, it is intended to cover various modifications and (as would be apparent to those skilled in the art). Therefore, the scope of the appended claims should be accorded the broadest interpretation so as to encompass all such modifications.

What is claimed is:

1. A device monitor for RF and DC measurement, coupled to a measurement instrument via a probe, the device monitor comprising:
   a plurality of test cells arranged substantially in line, wherein each test cell comprises:
   a device under test (DUT);
   an input pad, connected to an input of the device under test (DUT) and coupled to an output port of the measurement instrument via the probe;
   an output pad, connected to an output of the device under test (DUT) and coupled to an input port of the measurement instrument via the probe;
   a plurality of reference pads, connected to the device under test (DUT) and coupled to a reference potential of the measurement instrument via the probe;
   wherein the input pad, the output pad and the reference pads are arranged substantially in line and only one of the reference pads is disposed between the input pad and the output pad.

2. The device monitor as claimed in claim 1, wherein the reference potential is a ground potential.

3. The device monitor as claimed in claim 1, wherein the device under test (DUT) is disposed between the input pad and the output pad.

4. The device monitor as claimed in claim 1, wherein input of the device under test (DUT) is a gate and the output of the device under test (DUT) is a drain, wherein the device under test (DUT) is a metal oxide semiconductor field effect transistor (MOSFET), a metal semiconductor field effect transistor (MESFET) or a pseudo high electron mobility transistor (pHEMT).

5. The device monitor as claimed in claim 1, wherein the input of the device under test (DUT) is a base and the output of the device under test (DUT) is a collector, wherein the device under test (DUT) is a bipolar junction transistor (BJT) or a hetero-junction bipolar transistor (HBT).

6. The device monitor as claimed in claim 1, wherein the device under test is a varactor, a metal-insulator-metal (MIM) capacitor or a spiral inductor.

7. The device monitor as claimed in claim 1, wherein the device monitor is disposed in a scribe line.

8. The device monitor as claimed in claim 1, wherein the device monitor comprises only three test cells.

9. The device monitor as claimed in claim 1, further comprising a dummy pad.

10. The device monitor as claimed in claim 1, wherein the reference pads are a first reference pad and a second reference pad, wherein a sequence of the pads of each test cell is the first reference pad, the input pad, the second reference pad and the output pad.

* * * * *